US011303306B2

(12) United States Patent
Ortyl, III et al.

(10) Patent No.: US 11,303,306 B2
(45) Date of Patent: Apr. 12, 2022

(54) NARROWBAND IQ EXTRACTION AND STORAGE

(71) Applicant: Parsons Corporation, Centreville, VA (US)

(72) Inventors: Nicholas E. Ortyl, III, Bedford, MA (US); Samantha S. Palmer, Henrico, VA (US); Joseph Payton, Fredericksburg, VA (US)

(73) Assignee: PARSONS CORPORATION, Centreville, VA (US)

( * ) Notice: Subject to any disclaimer, the term of this patent is extended or adjusted under 35 U.S.C. 154(b) by 0 days.

(21) Appl. No.: 17/153,223

(22) Filed: Jan. 20, 2021

(65) Prior Publication Data

US 2021/0226649 A1 Jul. 22, 2021

Related U.S. Application Data

(60) Provisional application No. 62/963,373, filed on Jan. 20, 2020.

(51) Int. Cl.
*H03K 9/00* (2006.01)
*H04L 27/00* (2006.01)
*H04B 1/00* (2006.01)
*H03D 3/00* (2006.01)
*H04B 1/10* (2006.01)
*H04B 1/403* (2015.01)

(52) U.S. Cl.
CPC .......... *H04B 1/0003* (2013.01); *H03D 3/006* (2013.01); *H04B 1/1036* (2013.01); *H04B 1/406* (2013.01)

(58) Field of Classification Search
CPC .... H04B 1/0003; H04B 1/1036; H04B 1/406; H03D 3/006; G06F 16/906

USPC ........................................................ 375/316
See application file for complete search history.

(56) References Cited

U.S. PATENT DOCUMENTS

| 5,365,592 | A | 11/1994 | Horner et al. |
| 5,436,847 | A | 7/1995 | Schroer et al. |
| 5,867,535 | A | 2/1999 | Phillips et al. |
| 6,078,736 | A | 6/2000 | Guccione |
| 6,539,438 | B1 | 3/2003 | Ledzius et al. |

(Continued)

FOREIGN PATENT DOCUMENTS

| CN | 201476875 | 5/2010 |
| CN | 101826889 | 9/2010 |

(Continued)

OTHER PUBLICATIONS

Axell, Erik, et al., "Optimal and Sub-Optimal Spectrum Sensing of OFDM Signals in Known and Unknown Noise Variance." IEEE Journal on Selected Areas in Communications, vol. 29, No. 2, Feb. 2011, pp. 290-304.

(Continued)

*Primary Examiner* — Tanmay K Shah
(74) *Attorney, Agent, or Firm* — Michael C. Martensen (57) ABSTRACT

Capturing, extracting and storing narrowband IQ data for later processing enables timely and efficient analysis. As wideband capture of RF information includes noise and non-signal elements, the present invention detects, extracts and stores narrowband IQ signals for later assessment. By transforming a high-volume data stream to a collection of smaller narrowband signals with greatly reduced storage and on-board processing requirements the present invention facilitates the capability to analyze signals of interest in an otherwise denied environment.

25 Claims, 7 Drawing Sheets

(56) References Cited

U.S. PATENT DOCUMENTS

| | | |
|---|---|---|
| 6,874,145 B1 | 3/2005 | Ye |
| 7,210,121 B2 | 4/2007 | Xia et al. |
| 7,317,761 B2 | 1/2008 | Lozhkin |
| 7,320,062 B2 | 1/2008 | Master et al. |
| 7,349,503 B2 | 3/2008 | Husted et al. |
| 7,366,246 B2 | 4/2008 | Walker et al. |
| 7,369,485 B2 | 5/2008 | Halford et al. |
| 7,403,505 B2 | 7/2008 | Yoon et al. |
| 7,430,257 B1 | 9/2008 | Shattil |
| RE41,130 E | 2/2010 | Fette et al. |
| 7,684,467 B2 | 3/2010 | Li et al. |
| 7,929,937 B2 | 4/2011 | Koivunen et al. |
| 7,937,601 B2 | 5/2011 | Bakker et al. |
| 7,987,151 B2 | 7/2011 | Schott et al. |
| 7,987,432 B1 | 7/2011 | Grechishkin et al. |
| 8,086,836 B2 | 12/2011 | Chong et al. |
| 8,364,946 B2 | 1/2013 | Ishebabi |
| 8,412,111 B2 | 4/2013 | Talwar et al. |
| 8,615,206 B2 | 12/2013 | Meng |
| 8,677,378 B2 | 3/2014 | Murotake et al. |
| 8,763,004 B1 | 6/2014 | Callahan, III |
| 8,850,411 B2 | 9/2014 | Kelem et al. |
| 9,663,659 B1 | 5/2017 | Harlow |
| 2003/0011514 A1 | 1/2003 | Krichofer et al. |
| 2004/0093595 A1 | 5/2004 | Bilange |
| 2005/0120346 A1 | 6/2005 | Sprigg |
| 2005/0125513 A1 | 6/2005 | Sin-Ling Lam et al. |
| 2006/0195840 A1 | 8/2006 | Sundarrajan et al. |
| 2006/0218549 A1 | 9/2006 | Hsu et al. |
| 2006/0248445 A1 | 11/2006 | Rogerson et al. |
| 2007/0256073 A1 | 11/2007 | Troung et al. |
| 2008/0040507 A1 | 2/2008 | Hsu et al. |
| 2008/0134143 A1 | 6/2008 | Hoerentrup et al. |
| 2008/0147705 A1 | 6/2008 | Bansal et al. |
| 2008/0198948 A1 | 8/2008 | Tang |
| 2008/0318544 A1 | 12/2008 | Wang et al. |
| 2009/0031396 A1 | 1/2009 | Jung et al. |
| 2009/0119773 A1 | 5/2009 | D'Amore |
| 2009/0129493 A1 | 5/2009 | Zhang et al. |
| 2009/0215390 A1 | 8/2009 | Ku et al. |
| 2009/0279626 A1 | 11/2009 | Wang |
| 2009/0287894 A1 | 11/2009 | Renno |
| 2009/0290552 A1 | 11/2009 | Bertorelle |
| 2009/0307540 A1 | 12/2009 | Razazian et al. |
| 2009/0313620 A1 | 12/2009 | Sedukhin et al. |
| 2010/0086074 A1 | 4/2010 | Chen et al. |
| 2010/0138501 A1 | 6/2010 | Clinton et al. |
| 2010/0142643 A1 | 6/2010 | Ueda et al. |
| 2010/0202574 A1 | 8/2010 | Chen et al. |
| 2010/0205274 A1 | 8/2010 | Gharabally et al. |
| 2010/0226454 A1 | 9/2010 | Bliss et al. |
| 2010/0235261 A1 | 9/2010 | Lloyd et al. |
| 2010/0306773 A1 | 12/2010 | Lee et al. |
| 2010/0319051 A1 | 12/2010 | Bafna et al. |
| 2011/0296412 A1 | 12/2011 | Banga et al. |
| 2012/0023194 A1 | 1/2012 | Ruiz-Velasco et al. |
| 2012/0030672 A1 | 2/2012 | Zygmuntowicz et al. |
| 2012/0036552 A1 | 2/2012 | Dare et al. |
| 2012/0054184 A1 | 3/2012 | Masud et al. |
| 2012/0066679 A1 | 3/2012 | Pappas et al. |
| 2012/0151479 A1 | 6/2012 | Kothari |
| 2012/0303695 A1 | 11/2012 | Michel et al. |
| 2013/0061222 A1 | 3/2013 | Hwang et al. |
| 2013/0067089 A1 | 3/2013 | Synytskyy et al. |
| 2013/0102254 A1 | 4/2013 | Cyzs et al. |
| 2013/0111328 A1 | 5/2013 | Khanna et al. |
| 2013/0167135 A1 | 6/2013 | Neumann et al. |
| 2013/0181867 A1 | 7/2013 | Sturdivant et al. |
| 2013/0191495 A1 | 7/2013 | Almstrand et al. |
| 2013/0198734 A1 | 8/2013 | Biswas et al. |
| 2013/0212559 A1 | 8/2013 | Lehtimaki et al. |
| 2013/0227565 A1 | 8/2013 | Lee et al. |
| 2013/0283400 A1 | 10/2013 | Schneider et al. |
| 2013/0308940 A1 | 11/2013 | Kpodzo et al. |
| 2013/0326499 A1 | 12/2013 | Mowatt et al. |
| 2013/0332991 A1 | 12/2013 | Rivera |
| 2013/0346965 A1 | 12/2013 | Conlan et al. |
| 2014/0007048 A1 | 1/2014 | Qureshi et al. |
| 2014/0007122 A1 | 1/2014 | Udeshi et al. |
| 2014/0072947 A1 | 3/2014 | Boguraev |
| 2014/0079235 A1 | 3/2014 | Lyons |
| 2015/0270917 A1 | 9/2015 | Roman et al. |
| 2015/0356431 A1 | 12/2015 | Saxena |
| 2017/0011625 A1 | 1/2017 | Stelzig et al. |
| 2020/0162559 A1 | 5/2020 | Sustaeta et al. |
| 2020/0242516 A1 | 7/2020 | Dhingra et al. |

FOREIGN PATENT DOCUMENTS

| | | |
|---|---|---|
| CN | 202794534 | 3/2013 |
| CN | 102158242 | 7/2013 |
| DE | 102007034851 | 1/2009 |
| KR | 20020016434 | 3/2002 |

OTHER PUBLICATIONS

Bokharaiee, Simin, "Blind Spectrum Sensing for OFDM-Based Cognitive Radio Systems." IEEE Transactions on Vehicular Technology, vol. 60, No. 3, Mar. 2011, pp. 858-871.

Chen, Hou-Shin, et al., "Spectrum Sensing for OFDM Systems Employing Pilot Tones," IEEE Transactions on Wireless Communications, vol. 8, No. 12, Dec. 2009, pp. 5862-5870.

Rui, Yun, "Frequency Domain Discrete Fourier Transform Spread Generalized Multi-Carrier System and Its Performance Analysis," Computer Communications 32 (2009), pp. 456-464.

Ehringer, "The Dalvik Virtual Machine Architecture", 8 pages, (Mar. 2010).

Li, et al., "XVM: A Bridge Between XML Data and Its Behavior", pp. 155-163, (May 17-22, 2004).

Slade, et al., "Reconfigurable Computing Application Frameworks," Brigham Young University, 10 pages (2003).

Boano, et al., "Controllable Radio Interference for Experimental and Testing Purposes in Wireless Sensor Networks," www.soda.swedish-ict.se, 8 pages (Apr. 20, 2015).

SPIRENT Communications of Eatontown, L.P., "Spirent Communications TAS 4600A Noise and Interference Emulator Dperations Manual," 168 pages (2001).

ITU, "Radio Regulations of the International Telecommunication Union Radiocommunication Sector (ITU-R) (2012 Ed.)", 432 pages (2012).

Al-Khaieeb et al. "Recurring and Novel Class Detection Using Class-Based Ensemble for Evolving Data Stream", IEEE Transactions on Knowlede and Data Engineering, IEEE Service Center, Los Alamitos, CA, US, vol. 28, No. 10, Oct. 1, 2016, pp. 2752-2764.

Patent Cooperation Treaty Application No. PCT/US2020/046808, International Search Report and Written Opinion, Applicant Parsons Corporation, dated Nov. 18, 2020.

Patent Cooperation Treaty Application No. PCT/US2020/055369, International Search Report and Written Opinion, Applicant Parsons Corporation, dated Feb. 5, 2021.

Mankun, Xu, et al. "A New Time-Frequency Spectrogram Analysis of FH Signals by Image Enhancement and Mathematical Morphology", Image and Graphics, 2007, ICIG 2007, Fourth International Conference on, IEEE, Piscataway, NJ, USA Aug. 1, 2007, pp. 610-615.

Simstad, Erik, et al. "Medical Image Segmentation on GPUs—A Comprehensive Review", Medical Image Analysis, vol. 20, No. 1, Feb. 1, 2015, pp. 1-18.

Chu-Carrol, Jennifer, et al. "A Multi-Strategy and Multi-Source Approach to Question Answering", Jan. 1, 2006, URL: https://www.egr.msu.edu/~jchai/QAPapers/ibm.prager.pdf, pp. 1-8.

Abderrazzak, Samadi, et al. "A Syntactic and Semantic Multi-Agent Based Question Answering System for Collaborative E-Learning", 2018 4th International Converence on Optimization and Applications (ICOA), IEEE, Apr. 26, 2018, pp. 1-4.

Patent Cooperation Treaty Application No. PCT/US2020/055370, International Search Report and Written Opinion, Applicant Parsons Corporation, dated Mar. 12, 2021.

NARROWBAND IQ EXTRACTION AND STORAGE

RELATED APPLICATION

The present application relates to and claims the benefit of priority to U.S. Provisional Patent Application No. 62/963,373 filed 20 Jan. 2020 which is hereby incorporated by reference in its entirety for all purposes as if fully set forth herein.

BACKGROUND OF THE INVENTION

Field of the Invention

Embodiments of the present invention relate, in general, to the capture and storage of Radio Frequency (RF) data and more particularly to extraction and storage of narrowband IQ data.

Relevant Background

At any one moment in time, the RF spectrum contains a vast amount of information. As the use of the RF spectrum to transport data grows so too does the interest in capturing and analyzing such data. The amount of data collected in what is referred to as wideband RF capture is based on an amount of the RF spectrum observed through a sampling rate (or how much data is taken within a given time frame). For example, the same amount of data may be collected through a high sampling rate over a small bandwidth as with a high bandwidth (spectrum) but with a low sampling rate.

As data collection increases so too do the requirements of processing power and storage leading to tradeoffs between storage time, responsiveness, processing speed, and even size, weight and power of equipment.

Not all information in the RF spectrum is useful information. Most of the RF information acquired while performing a wideband capture describes background noise/non-signal data. For example, to capture the 2.4 GHz band (from 2.4 GHz to 2.5 GHz) requires a minimum capture of 100 million complex samples (also known as I/Q (In-phase/Quadrature) samples per second. With a 16-bit Analog-to-Digital Converter (ADC), this is equivalent to 400 Megabytes per second of data which is both cumbersome to store and to process.

High volume data storage and portability is also a challenge despite the recent efforts to compress and manage large files. Large data files are cumbersome with which to interact over a network, difficult to transfer and problematic to analyze. In many instances the time and resources to transfer a large wideband recording, even when compressed, exceeds the time and resources required to capture the data. And the reconstitution of a compressed file further adds to resource requirements, time delays and data loss.

What is needed is a highly available datastore of select, narrowband I/Q data from signals of interest alongside the metadata and envelop parameters used to capture and extract such data. The challenge therefore is to identify signals from what is otherwise noise and efficiently store such data for near-real time analysis. These and other deficiencies of the prior art are addressed by one or more embodiments of the present invention.

Additional advantages and novel features of this invention shall be set forth in part in the description that follows, and in part will become apparent to those skilled in the art upon examination of the following specification or may be learned by the practice of the invention. The advantages of the invention may be realized and attained by means of the instrumentalities, combinations, compositions, and methods particularly pointed out in the appended claims.

SUMMARY OF THE INVENTION

High-volume RF data is transformed to a collection of smaller narrowband signals with greatly reduced storage and on-board processing facilitating the capability to analyze signals of interest in otherwise denied environments. A computer implemented system for IQ data extraction and storage includes, according to one embodiment of the present invention a digital sampling device configured to acquire time domain IQ data communicatively coupled to a data conversion module. The digital conversion module is configured to convert time domain IQ data collected the sampling device to frequency domain IQ data.

The system further includes a signal detection module communicatively coupled to the data conversion module configured to detect time and frequency envelope parameters from the frequency domain IQ data. Based on select time and frequency envelope parameters an extraction module, communicatively coupled to the signal detection module, is configured to extract narrowband IQ signal components from the frequency domain IQ data. In some instances of the present invention, the time and frequency envelope parameters include signal edges and ranges. Lastly, a non-transitory storage media is configured to receive and store the extracted narrowband IQ signal components.

In other embodiments of the present invention, the system for IQ data extraction and storage, the digital sampling device is a software defined radio which itself include the data conversion module. The system for IQ data extraction and storage can also include a non-transitory data storage buffer communicatively coupled to the digital sampling device and the extraction module. This storage buffer can be configured to receive, and store acquired time domain IQ data for later processing.

In other versions of the present invention the signal detection module includes instructions executable by a processor to segment and separate frequency domain IQ data from noise.

The system for IQ data extraction and storage of the present invention may also include a formatting module wherein the formatting module associates extracted narrowband IQ signal components with the time and frequency envelope parameters. In doing so the formatting module includes instructions executable by a processor to tag extracted narrowband IQ signal components with time and frequency envelope parameters.

In other versions of the present invention the extraction module includes instructions executable by a processor to digitally down convert time domain IQ data including instructions to frequency shift and down sample the frequency domain IQ data to extract a narrowband IQ of a narrow signal. In other versions of the present invention the extraction module includes instructions executable by a processor to polyphase resample frequency domain IQ data. These processes may be done by a graphic, central processing unit, or in some cases an FPGA.

A method for IQ data extraction and storage, according to one embodiment of the present invention, begins by acquiring IQ time domain data by a digital sampling device. The time domain IQ data is thereafter converted to frequency domain IQ data. From that frequency domain IQ data time and frequency envelope parameters are detected leading to the extraction of narrowband IQ signal components based on select time and frequency envelope parameters. The method concludes by receiving and storing, at a non-transitory storage media, the extracted narrowband IQ signal components.

Other aspects of a method IQ data extraction and storage include buffering acquired IQ data for later processing. Another aspect of the methodology of present invention is segmenting and separating frequency domain IQ data from noise and associating extracted narrowband IQ signal components with time and frequency envelope parameters. The time and frequency envelope parameters can include signal edges and ranges.

Extracting narrowband IQ signals can, according to another version of the present invention, include digitally down converting time domain IQ data as well as digitally down converting, frequency shifting and down sampling frequency domain IQ data. Extracting can also include polyphase resampling frequency domain IQ data.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein.

The Figures depict embodiments of the present invention for purposes of illustration only. Like numbers refer to like elements throughout. In the figures, the sizes of certain lines, layers, components, elements or features may be exaggerated for clarity. Moreover, one skilled in the art will readily recognize from the following discussion that alternative embodiments of the structures and methods illustrated herein may be employed without departing from the principles of the invention described herein.

DESCRIPTION OF THE INVENTION

Capturing, extracting and storing narrowband IQ data for later processing enables timely and efficient analysis. As wideband capture of RF information includes noise and non-signal elements, the present invention detects, extracts and stores narrowband IQ signals for later assessment. By transforming a high-volume data stream to a collection of smaller narrowband signals with greatly reduced storage and on-board processing requirements, the present invention facilitates the capability to analyze signals of interest in an otherwise denied environment.

Embodiments of the present invention are hereafter described in detail with reference to the accompanying Figures. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

The terminology used herein is for the purpose of describing particular embodiments only and is not intended to be limiting of the invention. As used herein, the singular forms "a," "an" and "the" are intended to include the plural forms as well, unless the context clearly indicates otherwise. Thus, for example, reference to "a component surface" includes reference to one or more of such surfaces.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

It will be also understood that when an element is referred to as being "on," "attached" to, "connected" to, "coupled"

with, "contacting", "mounted" etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

As used herein, the following terms are understood to have the meaning:

- ADC—Analog to Digital converter—the part of an SDR that converts analog voltages (like those originating from an antenna) to a sequence of numeric values.
- Bandwidth—A range of frequencies within a given band, in particular that used for transmitting a signal.
- DDC (Digital Down Conversion)—is a technique that takes a band limited high sample rate digitized signal, mixes the signal to a lower frequency and reduces the sample rate while retaining all the information.
- DSP (Digital Signal Processing)—the use of digital processing, such as by computers or more specialized digital signal processors, to perform a wide variety of signal processing operations.
- Envelope Parameter—Envelope parameters or "signal extents" define a range in which a signal lies in the time and frequency domains. For example, By specifying this signal started at 20 seconds into a recording/stream and ended at 20.5 seconds, within the frequency range of 101 and 101.1 MHz, the extents/parameters needed to fully contain the signal are specified.
- FFT (Fast Fourier Transform)—A Digital Signal processing function that is used to convert time series information into a series of frequencies, by arranging the periodicity of the data into a series of bins representing a range of frequencies.
- FPGA (Field-Programmable Gate Array)—an integrated circuit designed to be configured by a customer or a designer after manufacturing.
- GPU (Graphics Processing Unit)—is a specialized electronic circuit designed to rapidly manipulate and alter memory to accelerate the creation of images in a frame buffer intended for output to a display device. Their highly parallel structure makes them more efficient than general-purpose central processing units (CPUs) for algorithms that process large blocks of data in parallel.
- I/Q Samples/data (In-phase and Quadrature Modulated Samples)—often used in RF applications, form the basis of complex RF signal modulation and demodulation, both in hardware and in software, as well as in complex signal analysis. In electrical engineering, a sinusoid with angle modulation can be decomposed into, or synthesized from, two amplitude-modulated sinusoids that are offset in phase by one-quarter cycle ($\pi/2$ radians). All three functions have the same center frequency. These amplitude modulated sinusoids are known as the in-phase and quadrature components. I is the In-Phase signal component while Q is the Quadrature signal component.
- Narrowband—Describes a sampled capture or single signal (or aggregate of subchannels) that occupies a relatively small bandwidth. For the purposes of this document, signals that are less than 20 MHz (e.g. a 10 MHz LTE channel or a 200 kHz FM radio broadcast) would be considered Narrowband.
- RBW (Resolution Bandwidth)—In frequency domain data, this is the minimum frequency unit discernible. For example, to reliably detect lower power signals with a bandwidth of 1 MHz, the resolution bandwidth of should be ideally lower than 1 MHz.
- RF—Radio Frequency—Used for wireless communications, and physical sensing, RF Energy is one form of electromagnetic energy which consists of waves of electric and magnetic energy moving together (radiating) through space, oscillating at various rates. The area where these waves are found is called an electromagnetic field.
- RF Spectrum (aka Radio Spectrum)—The part of the electromagnetic spectrum with frequencies from 30 hertz to 300 GHz. Electromagnetic waves in this frequency range, called radio waves, are widely used in modern technology, particularly in telecommunications.
- Sampling Rate—A description of how many times per second an RF signal is sampled
- Signal of Interest (SOI): SOI is the signal or waveform that is of interest to the end user and is being retained as part of the narrowband IQ process described in this document.
- Software Defined Radio—(SDR) a radio communication system where components that have been traditionally implemented in hardware are instead implemented by means of software
- SWaP: Size, Weight, and Power
- Wideband—Describes a sampled capture or single signal (or aggregate of subchannels) that occupies a large bandwidth. For the purposes of this document, radio captures that are greater than 20 MHz (e.g. a 50 MHz WBT capture) would be considered Narrowband.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

Included in the description are flowcharts depicting examples of the methodology which may be used to extract and store IQ data. In the following description, it will be understood that each block of the flowchart illustrations, and combinations of blocks in the flowchart illustrations, can be implemented by computer program instructions. These computer program instructions may be loaded onto a computer or other programmable apparatus to produce a machine such that the instructions that execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The computer program instructions may also be loaded onto a computer or other programmable apparatus to cause a series of operational steps to be performed in the computer or on the other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve the manipulation of information elements. Typically, but not necessarily, such elements may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," "words", or the like. These specific words, however, are merely convenient labels and are to be associated with appropriate information elements.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

Upon reading this disclosure, those of skill in the art will appreciate additional alternative structural and functional designs for a system and a process for IQ data extraction and storage through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope of the invention.

Figure 1A:
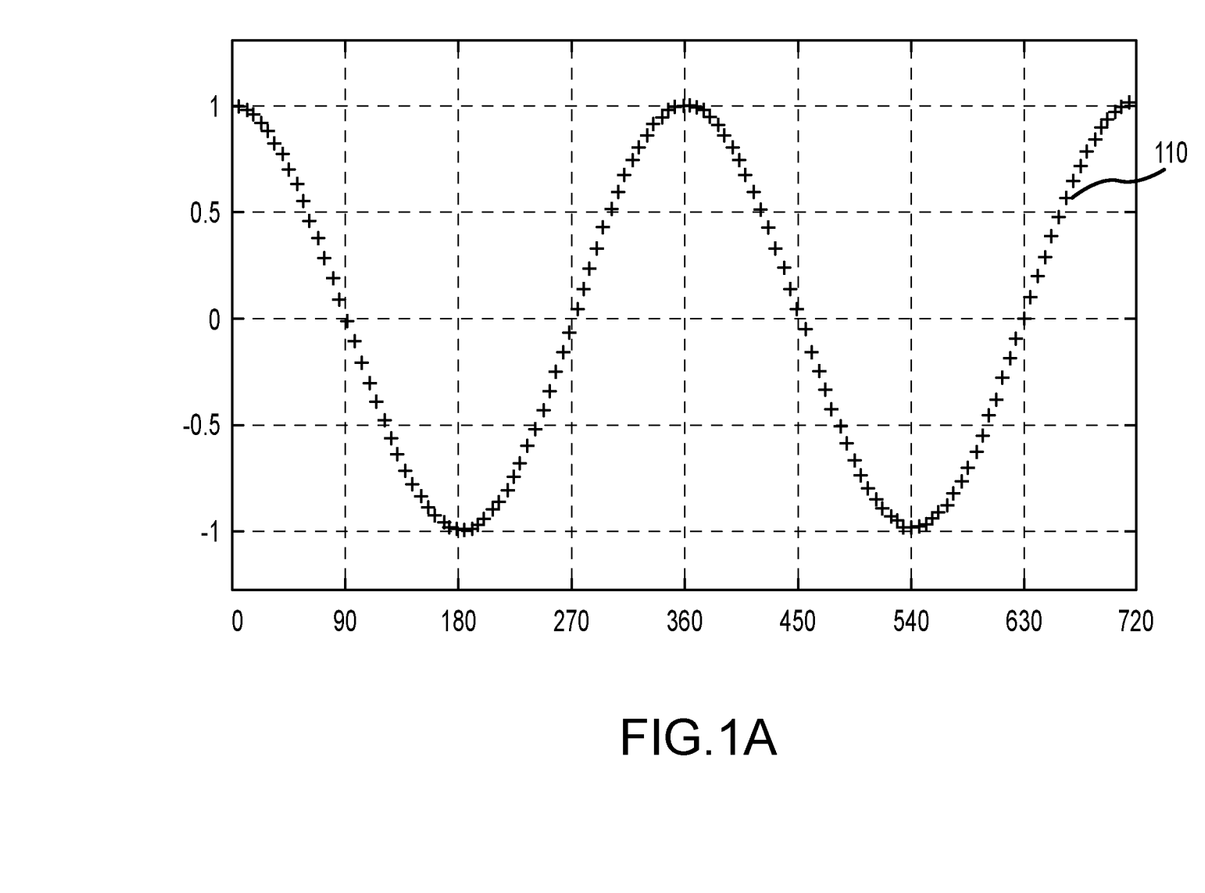
FIGS. 1A-1D depict two and three-dimensional renderings of RF signals as would be known to on skilled in the relevant art.

I/Q data is a precise representation of a RF signal. Typical two-dimensional representation of a RF signal fails to provide key information that is necessary to fully understand and analyze signal data. FIGS. 1A-1D provide a graphical perspective of a I/Q or true representation of signal that may be compared to a more common two-dimensional representation. FIG. 1A is a typical two—dimensional sinusoidal signal 110 representation. While it is seemingly telling of information such as amplitude and frequency, it is, in reality, quite lacking.

Figure 1B:
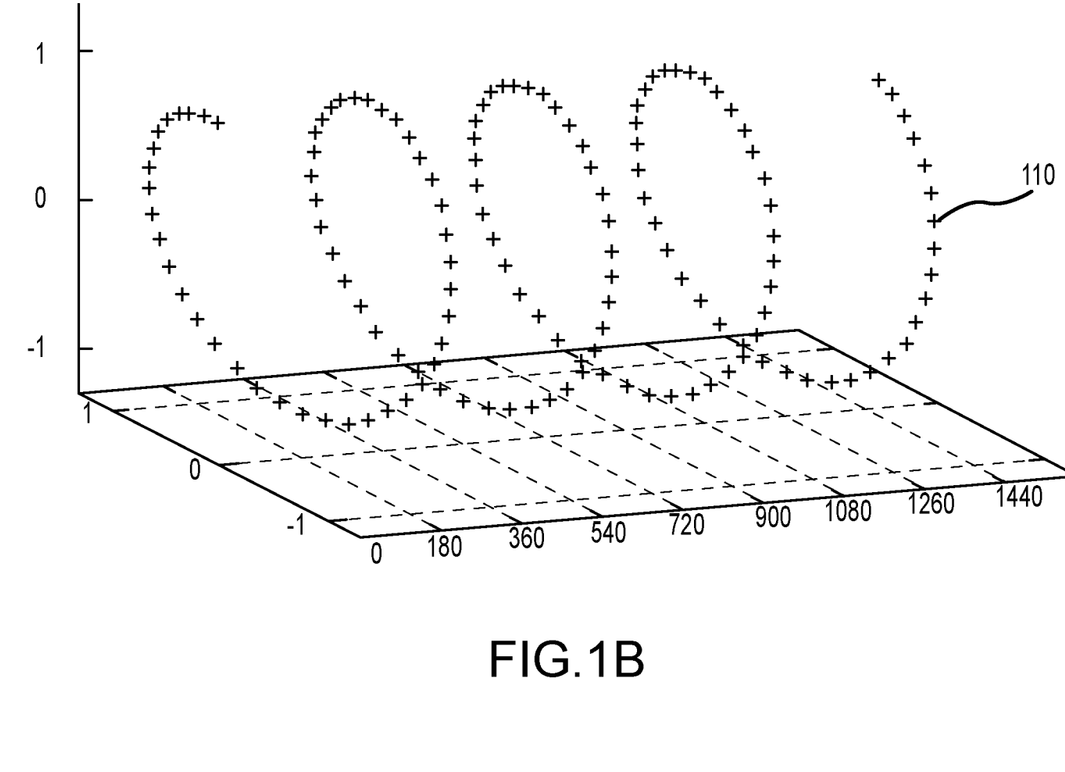

FIG. 1B presents the same signal 110 yet in an I/Q three-dimensional perspective. The signal it actually a corkscrew. Looking at the signal in FIG. 1B from the side produces the same image as FIG. 1A (I data) however viewing the signal of FIG. 1B from the top provides an entirely different image (Q data). And if viewed down axis, the signal becomes a circle in which a signal propagating clockwise is a positive while propagating counterclockwise is a negative signal. Indeed, the view of the signal down axis presents a polar coordinate image of how the signal propagates. I/Q data is therefore a rectangular representation of a signal's polar notation. In most instances the rectangular notation of I/Q data is used due to the ease of hardware implementations. In its basic format I/Q data comprises a vector component and a complex number, I+Qi.

Figure 1C:
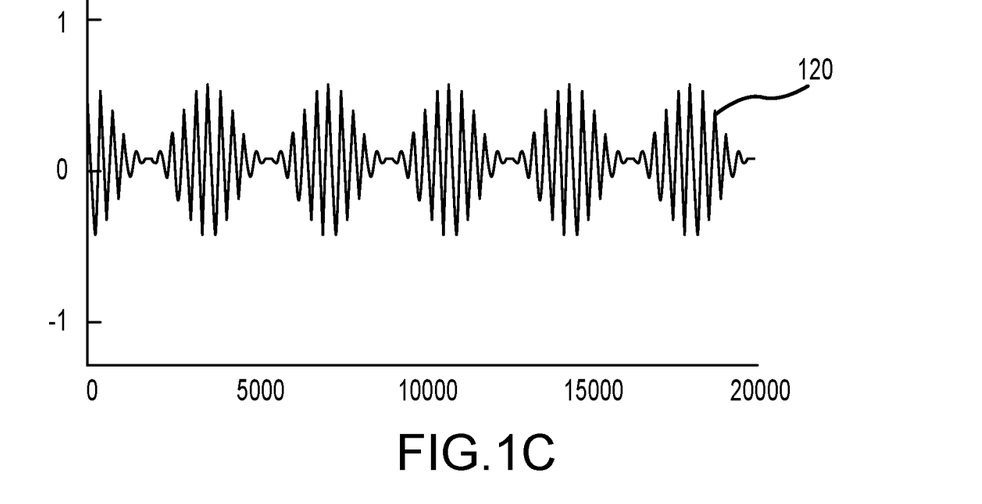
Figure 1D:
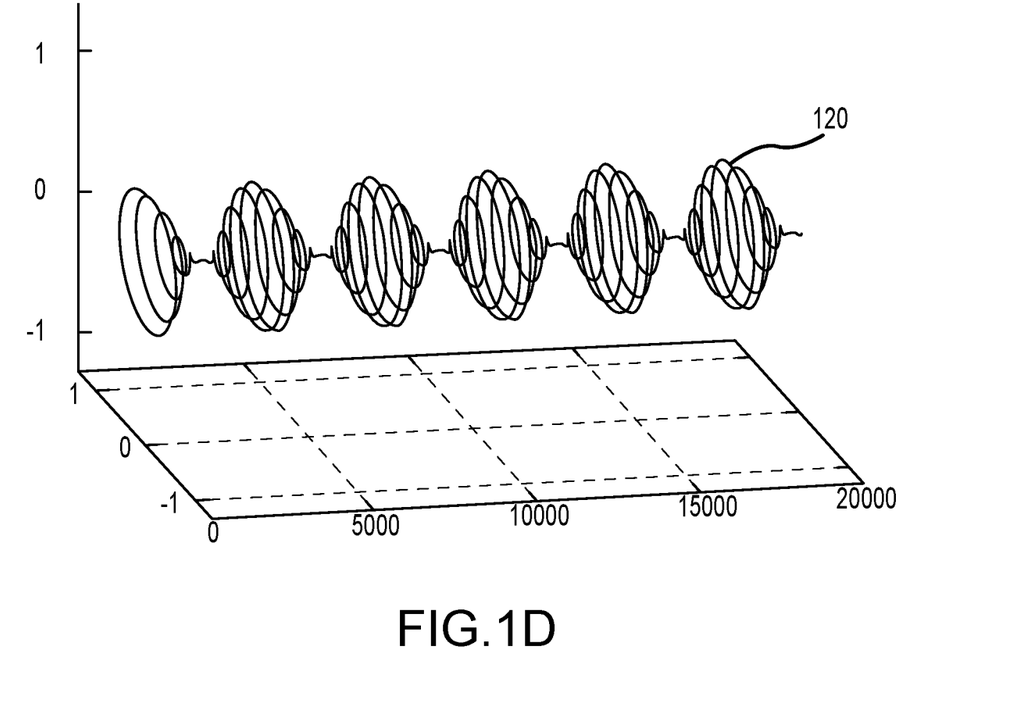

FIGS. 1C and 1D present a two-dimensional and three dimensional I/Q representation, respectively, of a more complex signal 120. One of reasonable skill in the relevant art will appreciate there are different ways to represent the same I/Q data sample. These methodologies are well known and will not be further discussed herein. A true signal is complex. It possesses attributes of phase, amplitude and time. These features, for select extracted signals, are the focus of the present invention.

One embodiment of the present invention detects, isolates and extracts IQ data from noise and thereafter stores the same for data retention, playback and further processing. The present invention makes use of captured wideband data by isolating signals from noise and storing narrowband IQ information in a highly accessible database. One embodiment of the present invention transforms a single high volume data stream into a collection of smaller narrowband signals that have greatly reduced data storage, on-board processing requirements. Such narrowband data facilitates the capability to analyze signals on a dismounted, stand-alone unit operating in an environment lacking network or larger communications and processing capabilities.

Figure 2:
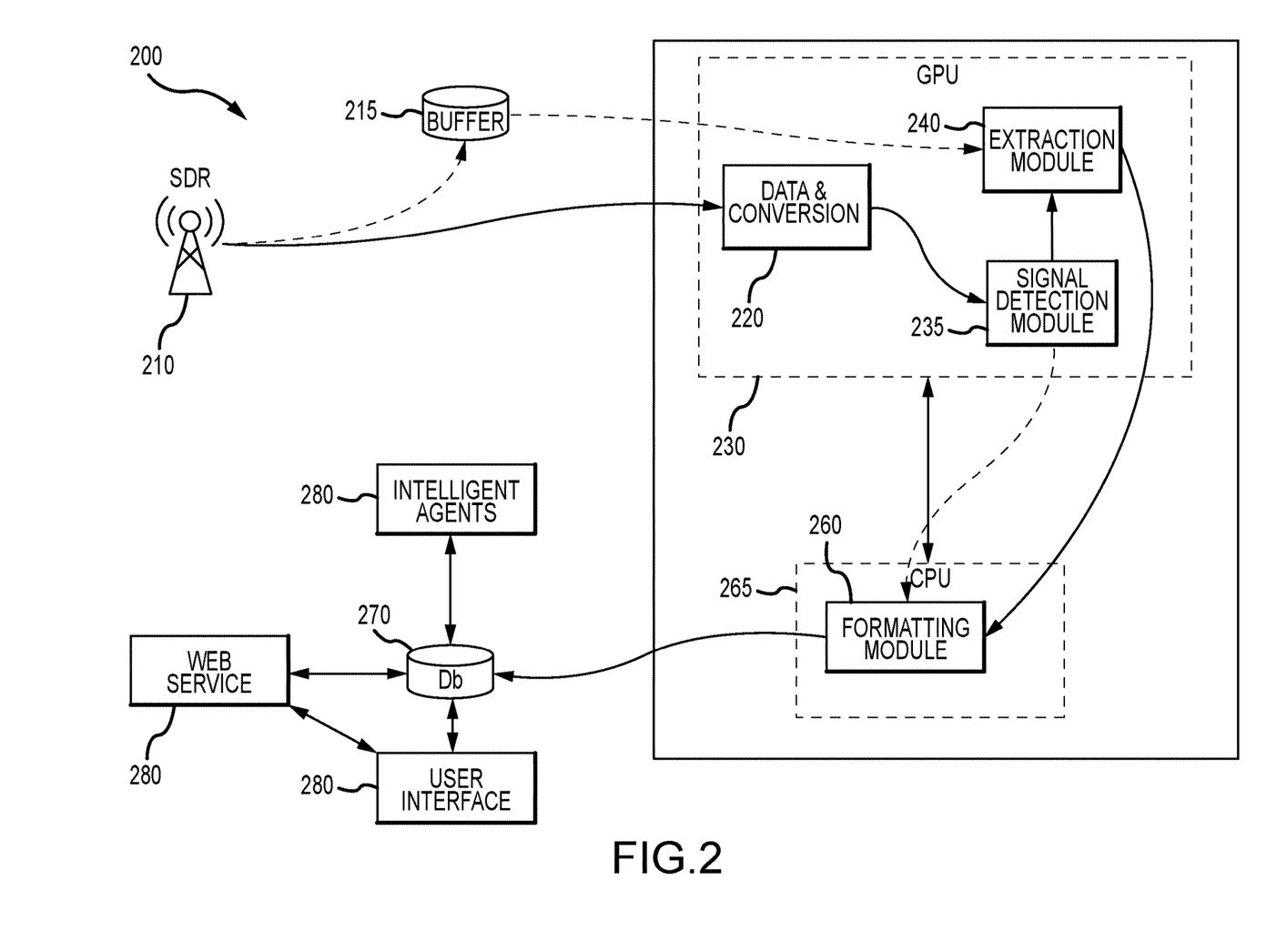
FIG. 2 presents a high-level block diagram and data flow architecture for narrowband IQ data extraction and storage according to one embodiment of the present invention.

FIG. 2 is a high-level block diagram of a system 200 for narrowband IQ data extraction and storage according to one embodiment of the present invention. RF data is typically streaming data meaning that it is continuously being generated by different sources and received in an aggregate form. Collection, storage and analysis of such data is conducted over a set period of time. As one of reasonable skill in the relevant art can appreciate the volume of collected streaming data in any environment can be significant. Streaming data differs from batch data analysis in which processing can be used to compute arbitrary queries over different sets of data. In batched data analysis results are derived from all the data it encompasses enabling deep analysis of big data sets at the expense of real time results. Streaming analysis requires a more focused efficient process but often does so at the price in-depth analysis.

As streaming data is continuous but efficient analysis is batched, a portion of streaming data is selected for examination, with the process by which the selection of signals to be examined becoming a critical component. The portion, which is normally based on time but may be based on other parameters, is selected in consideration of the need for meaningful results and the speed by which processing can occur. For example, the volume of data can be used as a selection criteria rather than a particular period of time. A larger sampling may provide additional information and more reliable, meaningful results but at the expense of delayed delivery of those outcomes. A shorter interval may be processed quickly yet yield results that are inconclusive. It is relevant that an objective of the present invention is to perform IQ extraction and storage process with maximum efficiency using various strategies such as parallelism and data pipelining to distribute the work throughout various parts of the system to provide meaningful yet timely results.

The present invention, according to one embodiment, captures data by way of a digital sampling device such as a software defined radio 210. While the resources of a software defined radio aid in the implementation of the present invention, one of reasonable skill in the relevant art will appreciate that other means by which to capture RF signal and IQ data are available and are within the scope of the present invention.

As shown in FIG. 2 data is captured by a software defined radio 210 or similar digital sampling device from various sources. The radio in this embodiment provides high precision time stamped data describing the time series in an I/Q data format. In one version of the invention data capture by the radio 210 is stored (buffered) 215 as RAM or high-speed SSD based storage in a manner that allows for rapid time indexing.

This aspect of the present invention provides for rapid, random access to large stores of RAM and disk-based IQ data collection platforms. Such specialized storage and retrieval mechanisms reduce access time to store and retrieve the IQ data, allowing additional time to perform the subsequent conversions and processing as needed to detect and extract the narrowband signals. As shown in FIG. 2 the buffering process is in parallel to other methodologies for narrowband extraction. Upon learning envelope parameters for select signals, data resident in the buffer can be quickly ascertained/retrieved for subsequent analysis.

Once collected, IQ data is converted to the frequency domain data. In one embodiment of the present invention this conversion is accomplished with a spectrum generation/ data conversion module 220 resident in the software defined radio using a high-speed FPGA (Hardware Accelerated) based Fast Fourier Transform (FFT) function to deliver time-stamped spectrum data. In other embodiments the conversion utilizes a Graphic Processor Unit (GPU) 230 (shown in FIG. 2), an additional FPGA or the like to carry out the conversion steps. The conversion of IQ data into the frequency domain sets readies data for the signal detection step of processing. In doing so, timestamps of the spectrum information are accurately aligned with the source IQ data ensuring that the extraction operation is completed successfully.

Recognize there is a tradeoff between resolution bandwidth and time resolution. Generally (while keeping the data storage requirements the same), the finer the signal detail looked for in time, the more course the frequency measurements will be and vice versa. The present invention optimizes data collection with storage based on ongoing determination of envelope parameters.

A signal detection module 235 receives frequency domain data in spectrum snapshots from which it identifies signals embedded within the RF environment. These snapshots are batch processed by, in one embodiment, a GPU 230 accelerated detection/segmentation process. This process builds an estimate of the noise floor providing a threshold to separate the signal(s) from the noise. Concurrently the signal detection module 235 ascertains envelope parameters defining edges of signals (i.e., frequency and time ranges). In one version of the present invention the signal detection process is akin to an image segmentation algorithm, analyzing the frequency domain snapshots over time as a 2-dimensional image. While such processing can take place in parallel using a GPU, further acceleration is possible with an FPGA optimized implementation.

An extraction module 240 receives, in one instance raw IQ data capture by and time-tagged by the software defined radio 210 via the buffer 215, and, in another instance, detected signals from the detection module 235. From this data narrowband signal components are extracted. The extraction process first moves through the collection of envelope parameters identified by the signal detection module 235, identifying the begin and end timestamps of each signal segment while loading the necessary time ranges. Any "dead space" or time periods where there are no signals present are disregarded and not processed further.

For each set of signal envelope parameters, IQ data samples are put through a digital down conversion process wherein the signal is frequency shifted and downsampled extracting the narrowband IQ of the now narrowed signal.

In one embodiment of the present invention the digital down conversion process is accomplished using a GPU 230. In such an approach digital down conversion is implemented through accelerated complex sinusoid generation and complex multiplication combined with a Finite Impulse Response (FIR) filter and decimation. Recall a finite Impulse Response Filter is a filter whose impulse response (or response to any finite length input) is of finite duration, because it settles to zero in finite time. This is in contrast to Infinite Impulse Response (IIR) filters, which may have internal feedback and may continue to respond indefinitely. Similarly, to decimate a filtered signal by M means to keep only every Mth sample.

The GPU can also digitally down convert signals using a polyphase resampling implementation, or a frequency domain based down conversion, the later being potentially faster since a FFT has already occurred at this point-recognizing that a frequency based down conversion will destroy phase information.

Digital down conversion can also be accomplished, according to another embodiment of the present invention, using a FPGA. By using a FPGA a work-pipeline can be established exploiting hard coded gates for the purpose of performing DDC operations in a rapid sequential (and or parallelized) manner. In the same manner polyphase resampling can be implemented using a FPGA providing efficient (albeit somewhat inflexible) DDC. It is worth noting that some degree of filtering can occur at this stage to minimize total processing time. For example, if the system operator does not have a use for signals that match/do not match a certain length or bandwidth profile, the present invention can simply choose to only process the relevant signals.

The use of a GPU or FPGA for digital down conversion depends on the capabilities and goals of the system and any tradeoffs that have to be considered. For example, when phase information needs to be preserved, then the down-conversion processes may become less efficient by injecting latency at this stage of processing. An example of this would be the angle-of arrival calculations needed for radio direction-finding applications. Considerations such as these may drive the implementation of the present invention to use a GPU vs an FPGA or vice versa or utilize an entirely different type of computational resource.

One objective of the present invention is to provide an easily accessible database of narrowband IQ data for further analysis. This objective is achieved by storage of narrowband IQ and associated information as a time tagged record in a NoSQL/document store style database 270. This record keeping facilitates addition of supplemental data at a later time as well as the ability to add additional references to other signal constructs (such as the determination that the signal is a piece of a larger signal, such as a pulse that is part of a frequency agile signal). Once stored in this fashion, such data allows signal information to be processed easily and more effectively both locally to the local SDR platform, or over a network.

A formatting module 260 interacts with the digitally down converted IQ data to tag each record and properly format the data for storage. Typically formatting of this type is accomplished with a general microprocessor 265. In addition to preparing IQ data for storage, envelope parameters identified during the detection phase are similarly stored in the database 270 housed on a non-transitory storage media facilitating later investigative processes 280.

Figure 3:
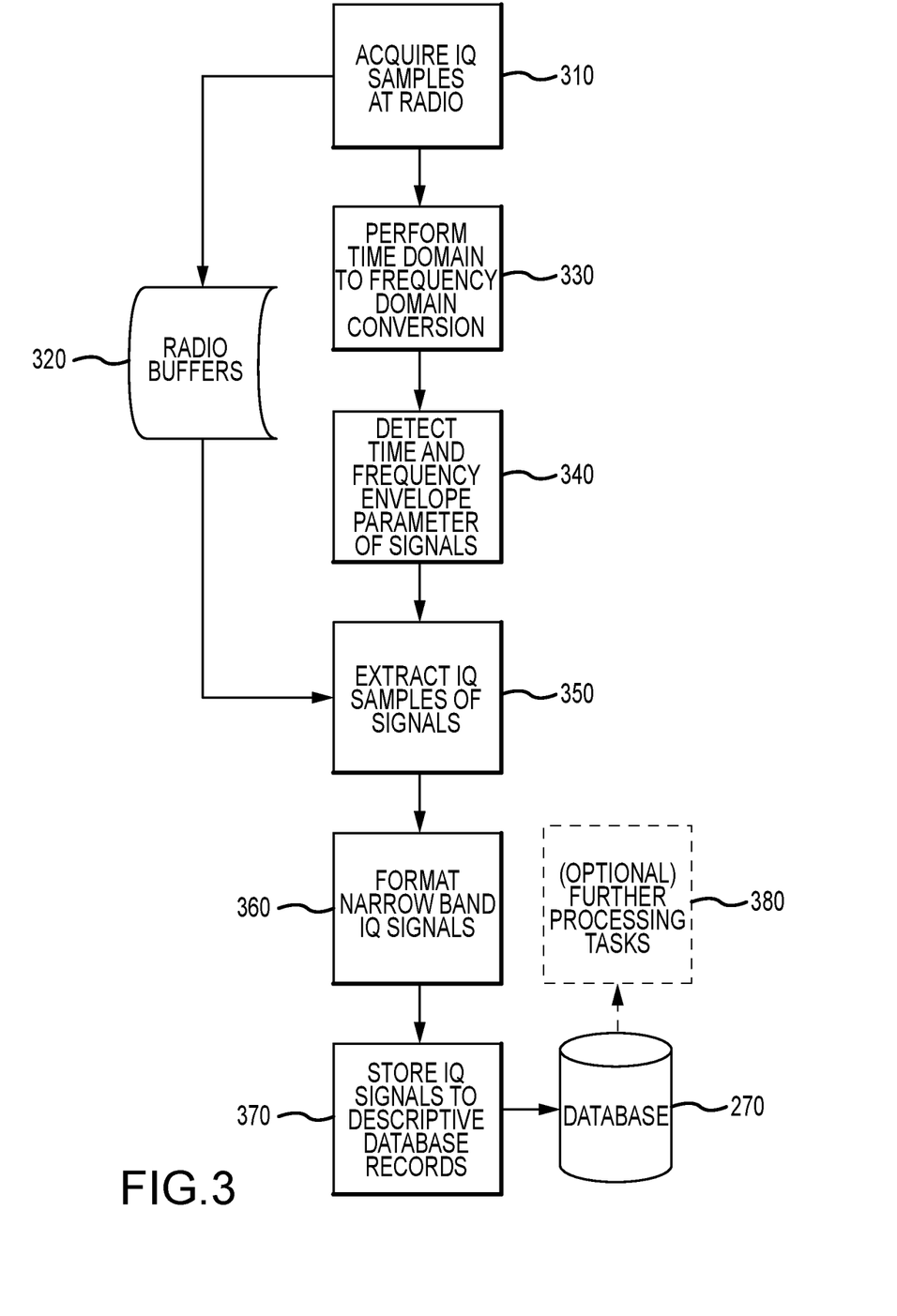
FIG. 3 is a flowchart of one methodology according the present invention for narrowband IQ data extraction and storage.
Figure 4:
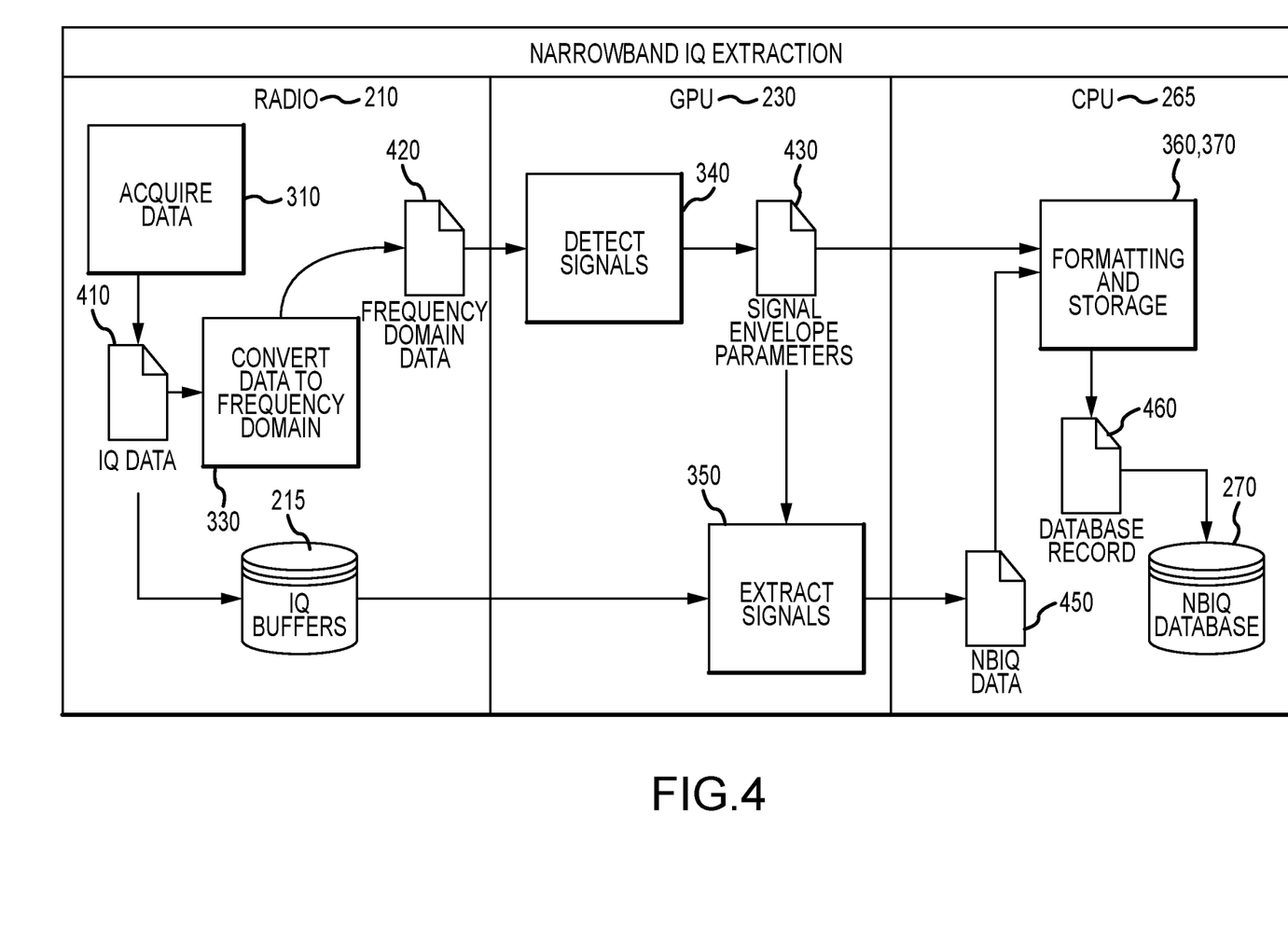
FIG. 4 is one embodiment of asset/resource allocation for the present invention of narrowband IQ data extraction and storage.

Additional understanding of the present invention can be gained with attention drawn to FIGS. 3 and 4. FIG. 3 is a flow chart of one embodiment of a process for IQ data extraction and storage while FIG. 4 provides an example of implementation processes and resource allocation. As described previously IQ data extraction and storage begins with acquiring 310 IQ data 400. In one embodiment IQ data 410 is collected using a software defined radio 310 while in other embodiments time domain IQ samples can be acquired from a digitizer or a digital sampling device.

Once acquired time domain IQ data 410 is both buffered 320 and separately converted 330 to frequency domain IQ data. In one embodiment the frequency domain IQ data 420 is processed to detect 340 time and frequency envelope parameters 430 of signals. The detection 340 of envelope parameters 430 leads to the extraction 350 of IQ signals gaining narrowband IQ data 450. The detection 340 of envelope parameters 430 and extraction 350 of IQ signals 450 based on these parameters can be implemented in one embodiment by a GPU 230 while in other embodiments these processes can be accomplished by a FPGA.

The extracted narrowband IQ signals 450 are formatted 360 and stored 370 as a database record 460 in a database along with the envelope parameters and detection models used to gain such information. The process concludes with post processing 380 the narrowband signals by accessing the narrowband IQ database.

The ability to sense important signals of interest (SOIs) in a crowded spectrum has become more and more difficult. As spectrum density grows, understanding what is in your environment at any given time has become increasingly complex.

Background characterization and spectrum monitoring requirements have driven the need for complete and precise coverage of the spectrum and accomplishing this with traditional RF acquisition systems has become prohibitively expensive and inefficient. Capturing, extracting and storing narrowband IQ data for later processing enables timely and efficient analysis. As wideband capture of RF information includes noise and non-signal the present invention detects and extracts IQ signals for later assessment. Transforming a high-volume data stream to a collection of smaller narrowband signals with greatly reduced storage and on-board processing requirements facilitates the capability to analyze signals of interest in an otherwise denied environment.

Figure 5:
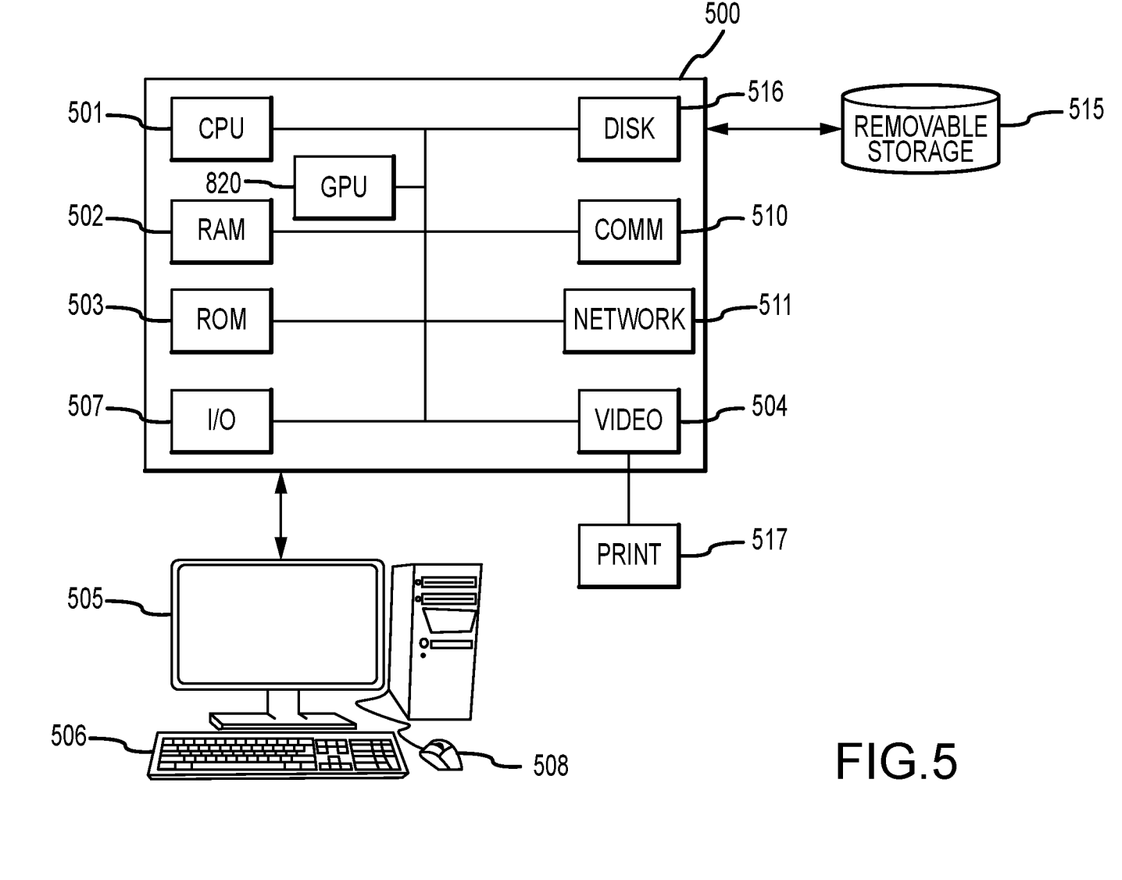
FIG. 5 is a block diagram of a computer system suitable for implementation of one or more embodiments of narrowband IQ data extraction and storage.

One of reasonable skill will also recognize that portions of the present invention may be implemented on a conventional or general-purpose computer system, such as a personal computer (PC), server, a laptop computer, a notebook computer, a handheld or pocket computer, and/or a server computer. FIG. 5 is a very general block diagram of a computer system in which software-implemented processes of the present invention may be embodied. As shown, system 500 comprises a central processing unit(s) (CPU) or processor(s) 501 coupled to a random-access memory (RAM) 502, a graphics processor unit(s) (GPU) 520, a read-only memory (ROM) 503, a keyboard or user interface 506, a display or video adapter 504 connected to a display device 505, a removable (mass) storage device 515 (e.g., floppy disk, CD-ROM, CD-R, CD-RW, DVD, or the like), a fixed (mass) storage device 516 (e.g., hard disk), a communication (COMM) port(s) or interface(s) 510, and a network interface card (NIC) or controller 511 (e.g., Ethernet). Although not shown separately, a real time system clock is included with the system 500, in a conventional manner.

CPU 501 comprises a suitable processor for implementing the present invention. The CPU 501 communicates with other components of the system via a bi-directional system bus 520 (including any necessary input/output (I/O) controller 507 circuitry and other "glue" logic). The bus, which includes address lines for addressing system memory, provides data transfer between and among the various components. Random-access memory 502 serves as the working memory for the CPU 501. The read-only memory (ROM) 503 contains the basic input/output system code (BIOS)—a set of low-level routines in the ROM that application programs and the operating systems can use to interact with the hardware, including reading characters from the keyboard, outputting characters to printers, and so forth.

Mass storage devices 515, 516 provide persistent storage on fixed and removable media, such as magnetic, optical, or magnetic-optical storage systems, flash memory, or any other available mass storage technology. The mass storage may be shared on a network, or it may be a dedicated mass storage. As shown in FIG. 5, fixed storage 516 stores a body of program and data for directing operation of the computer system, including an operating system, user application programs, driver and other support files, as well as other data files of all sorts. Typically, the fixed storage 516 serves as the main hard disk for the system.

In basic operation, program logic (including that which implements methodology of the present invention described below) is loaded from the removable storage 515 or fixed storage 516 into the main (RAM) memory 502, for execution by the CPU 501. During operation of the program logic, the system 500 accepts user input from a keyboard and pointing device 506, as well as speech-based input from a voice recognition system (not shown). The user interface 506 permits selection of application programs, entry of keyboard-based input or data, and selection and manipulation of individual data objects displayed on the screen or display device 505. Likewise, the pointing device 508, such as a mouse, track ball, pen device, or the like, permits selection and manipulation of objects on the display device. In this manner, these input devices support manual user input for any process running on the system.

The computer system 500 displays text and/or graphic images and other data on the display device 505. The video adapter 504, which is interposed between the display 505 and the system's bus, drives the display device 505. The video adapter 504, which includes video memory accessible to the CPU 501, provides circuitry that converts pixel data stored in the video memory to a raster signal suitable for use by a cathode ray tube (CRT) raster or liquid crystal display (LCD) monitor. A hard copy of the displayed information, or other information within the system 500, may be obtained from the printer 517, or other output device.

The system itself communicates with other devices (e.g., other computers) via the network interface card (NIC) 511 connected to a network (e.g., Ethernet network, Bluetooth wireless network, or the like). The system 500 may also communicate with local occasionally connected devices (e.g., serial cable-linked devices) via the communication (COMM) interface 510, which may include a RS-232 serial port, a Universal Serial Bus (USB) interface, or the like. Devices that will be commonly connected locally to the interface 510 include laptop computers, handheld organizers, digital cameras, and the like.

As will be understood by those familiar with the art, that the invention may be embodied in other specific forms without departing from the spirit or essential characteristics thereof. Likewise, the particular naming and division of the modules, managers, functions, systems, engines, layers, features, attributes, methodologies, and other aspects are not mandatory or significant, and the mechanisms that implement the invention or its features may have different names, divisions, and/or formats. Furthermore, as will be apparent to one of ordinary skill in the relevant art, the modules, managers, functions, systems, engines, layers, features, attributes, methodologies, and other aspects of the invention can be implemented as software, hardware, firmware, or any combination of the three. Of course, wherever a component of the present invention is implemented as software, the component can be implemented as a script, as a standalone program, as part of a larger program, as a plurality of separate scripts and/or programs, as a statically or dynamically linked library, as a kernel loadable module, as a device driver, and/or in every and any other way known now or in the future to those of skill in the art of computer programming. Additionally, the present invention is in no way limited to implementation in any specific programming language, or for any specific operating system or environment. Accordingly, the disclosure of the present invention is intended to be illustrative, but not limiting, of the scope of the invention, which is set forth in the following claims.

In a preferred embodiment, the present invention can be implemented in software. Software programming code which embodies the present invention is typically accessed by a microprocessor from long-term, persistent storage media of some type, such as a flash drive or hard drive. The software programming code may be embodied on any of a variety of known media for use with a data processing system, such as a diskette, hard drive, CD-ROM, or the like. The code may be distributed on such media or may be distributed from the memory or storage of one computer system over a network of some type to other computer systems for use by such other systems. Alternatively, the programming code may be embodied in the memory of the device and accessed by a microprocessor using an internal bus. The techniques and methods for embodying software programming code in memory, on physical media, and/or distributing software code via networks are well known and will not be further discussed herein.

Generally, program modules include routines, programs, objects, components, data structures and the like that perform particular tasks or implement particular abstract data types. Moreover, those skilled in the art will appreciate that the invention can be practiced with other computer system configurations, including hand-held devices, multi-processor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located in both local and remote memory storage devices.

While there have been described above the principles of the present invention in conjunction with IQ data collection, extraction and storage, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

The invention claimed is:

1. A computer implemented system for IQ data extraction and storage, the system comprising:
   a digital sampling device configured to acquire time domain IQ data from a data stream of high volume data;
   a non-transitory data storage buffer communicatively coupled to the digital sampling device configured to receive, and store acquired time domain IQ data;
   a data conversion module communicatively coupled to the digital sampling device and in parallel with the non-transitory data storage buffer configured to convert a portion of the time domain IQ data to frequency domain IQ data;
   a signal detection module communicatively coupled to the data conversion module configured to detect ongoing time and frequency envelope parameters from the frequency domain IQ data;
   an extraction module, communicatively coupled to the signal detection module and the non-transitory data storage buffer, configured to extract narrowband IQ signal components based on the detected time and frequency envelope parameters; and
   a non-transitory storage media configured to receive and store extracted narrowband IQ signal components from the extraction module.

2. The computer implemented system for IQ data extraction and storage according to claim 1, wherein the digital sampling device is a software defined radio.

3. The computer implemented system for IQ data extraction and storage according to claim 2, wherein the software defined radio includes the data conversion module.

4. The computer implemented system for IQ data extraction and storage according to claim 1, wherein the signal detection module includes instructions executable by a processor to segment and separate frequency domain IQ data from noise.

5. The computer implemented system for IQ data extraction and storage according to claim 1, wherein time and frequency envelope parameters include signal edges and ranges.

6. The computer implemented system for IQ data extraction and storage according to claim 1, further comprising a formatting module wherein the formatting module associates extracted narrowband IQ signal components with time and frequency envelope parameters.

7. The computer implemented system for IQ data extraction and storage according to claim 6, wherein the formatting module includes instructions executable by a processor to tag extracted narrowband IQ signal components with time and frequency envelope parameters.

8. The computer implemented system for IQ data extraction and storage according to claim 7, wherein the processor is central processor.

9. The computer implemented system for IQ data extraction and storage according to claim 1, wherein the extraction module includes instructions executable by a processor to digitally down convert time domain IQ data.

10. The computer implemented system for IQ data extraction and storage according to claim 9, wherein the instructions to digitally down convert frequency domain IQ data include instructions to frequency shift and down sample the frequency domain IQ data to extract a narrowband IQ of a narrow signal.

11. The computer implemented system for IQ data extraction and storage according to claim 10, wherein the processor is a graphic processor.

12. The computer implemented system for IQ data extraction and storage according to claim 1, wherein the extraction module includes instructions executable by a processor to polyphase resample frequency domain IQ data.

13. The computer implemented system for IQ data extraction and storage according to claim 12, wherein the processor is a graphic processor.

14. The computer implemented system for IQ data extraction and storage according to claim 1, wherein the extraction module includes instructions executable by a processor to digitally down convert frequency domain IQ data.

15. The computer implemented system for IQ data extraction and storage according to claim 14, wherein the processor is a graphic processor.

16. The computer implemented system for IQ data extraction and storage according to claim 1, wherein the extraction module includes a field programmable gate array to digitally down convert acquired time domain IQ data.

17. The computer implemented system for IQ data extraction and storage according to claim 1, wherein the extraction module includes a field programmable gate array to polyphase resample frequency domain IQ data.

18. A method for IQ data extraction and storage implemented by a machine having one or more processors capable of executing a program of instructions stored on a non-transitory storage medium, the method comprising:
    acquiring by a digital sampling device time domain IQ data from a data stream of high volume data;
    receiving and thereafter storing by a non-transitory data storage buffer communicatively coupled to the digital sampling device acquired time domain IQ data;
    converting a portion of time domain IQ data to frequency domain IQ data in parallel with the receiving and storing of the acquired time domain IQ data in the non-transitory data storage buffer;
    detecting on an ongoing basis time and frequency envelope parameters from the frequency domain IQ data;
    extracting narrowband IQ signal components from the acquired time domain IQ data in the non-transitory data storage buffer based on the detected time and frequency envelope parameters; and
    receiving and storing, at a non-transitory storage media, extracted narrowband IQ signal components.

19. The method for IQ data extraction and storage according to claim 18, wherein detecting includes segmenting and separating frequency domain IQ data from noise.

20. The method for IQ data extraction and storage according to claim 18, wherein time and frequency envelope parameters include signal edges and ranges.

21. The method for IQ data extraction and storage according to claim 18, further comprising associating extracted narrowband IQ signal components with time and frequency envelope parameters.

22. The method for IQ data extraction and storage according to claim 18, wherein extracting includes digitally down converting time domain IQ data.

23. The method for IQ data extraction and storage according to claim 22, wherein extracting includes frequency shifting and down sampling the frequency domain IQ data.

24. The method for IQ data extraction and storage according to claim 18, wherein extracting includes polyphase resampling frequency domain IQ data.

25. The method for IQ data extraction and storage according to claim 18, wherein extracting includes digitally down converting frequency domain IQ data.

* * * * *